(12) United States Patent
McClure et al.

(10) Patent No.: US 7,132,767 B2
(45) Date of Patent: Nov. 7, 2006

(54) METHOD AND CIRCUIT FOR SWITCHOVER BETWEEN A PRIMARY AND A SECONDARY POWER SOURCE

(75) Inventors: David C. McClure, Carrollton, TX (US); Tom Youssef, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 31 days.

(21) Appl. No.: 10/754,023

(22) Filed: Jan. 8, 2004

(65) Prior Publication Data

US 2004/0160330 A1    Aug. 19, 2004

Related U.S. Application Data

(62) Division of application No. 09/626,550, filed on Jul. 27, 2000, now Pat. No. 6,787,938.

(51) Int. Cl.
*H01H 47/00* (2006.01)
(52) U.S. Cl. .................... 307/125; 307/64; 307/66
(58) Field of Classification Search ............... 307/64, 307/66, 125; 713/340
See application file for complete search history.

(56) References Cited

U.S. PATENT DOCUMENTS

| | | |
|---|---|---|
| 3,937,937 A | 2/1976 | McVey |
| 4,087,697 A | 5/1978 | Johnson |
| 4,428,020 A | 1/1984 | Blanchard, Jr. |
| 4,429,236 A | 1/1984 | Nitschke |
| 4,713,553 A | 12/1987 | Townsend et al. |
| 5,264,732 A | 11/1993 | Fiorina et al. |
| 5,717,936 A | 2/1998 | Uskali |
| 5,734,204 A | 3/1998 | Sobue |

*Primary Examiner*—Robert L. Deberadinis
(74) *Attorney, Agent, or Firm*—Lisa K. Jorgenson; Andre M. Szuwalski

(57) ABSTRACT

An integrated circuit and method for providing a switchover from the primary power source to the secondary power source to prevent a volatile element from losing stored data. The integrated circuit includes a forced power source switchover circuit for detecting that the supply level of the primary power source drops below a predefined threshold level. A switchover circuit on the integrated circuit initiates a switchover operation based upon the forced power source switchover circuit detecting that the supply level being received from the primary power source drops below the predefined threshold level. The detection by the forced power source switchover circuitry may occur on a signal level that transitions faster than a predetermined negative rate of change. The integrated circuit may be incorporated in any system having volatile elements, such as memory or a clock.

20 Claims, 6 Drawing Sheets

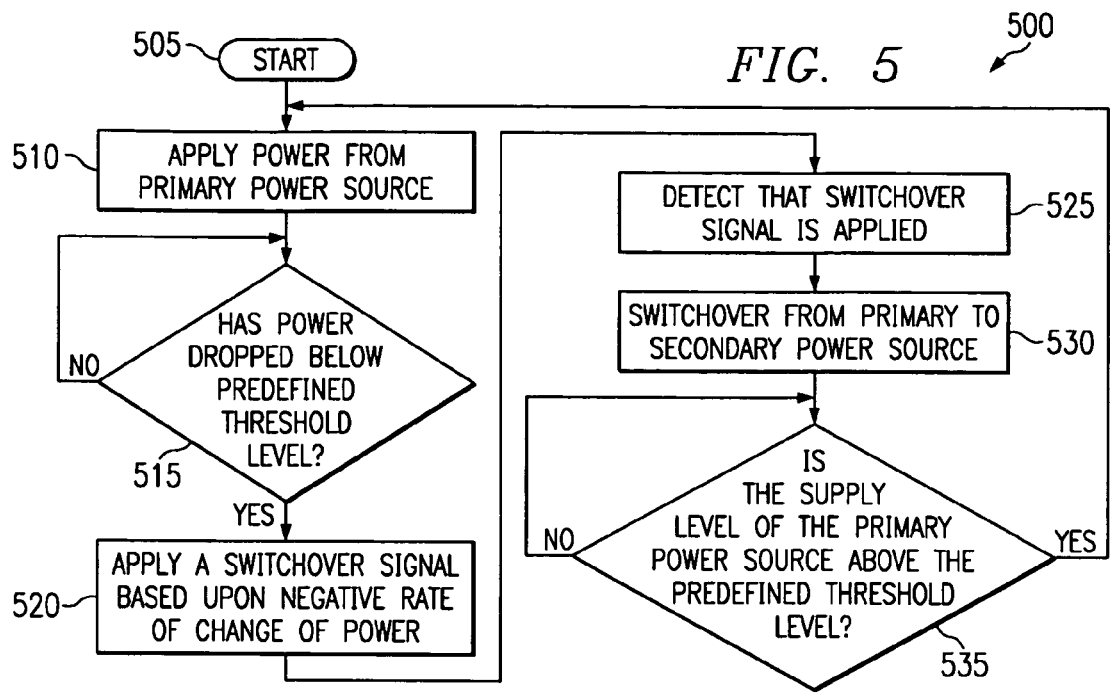
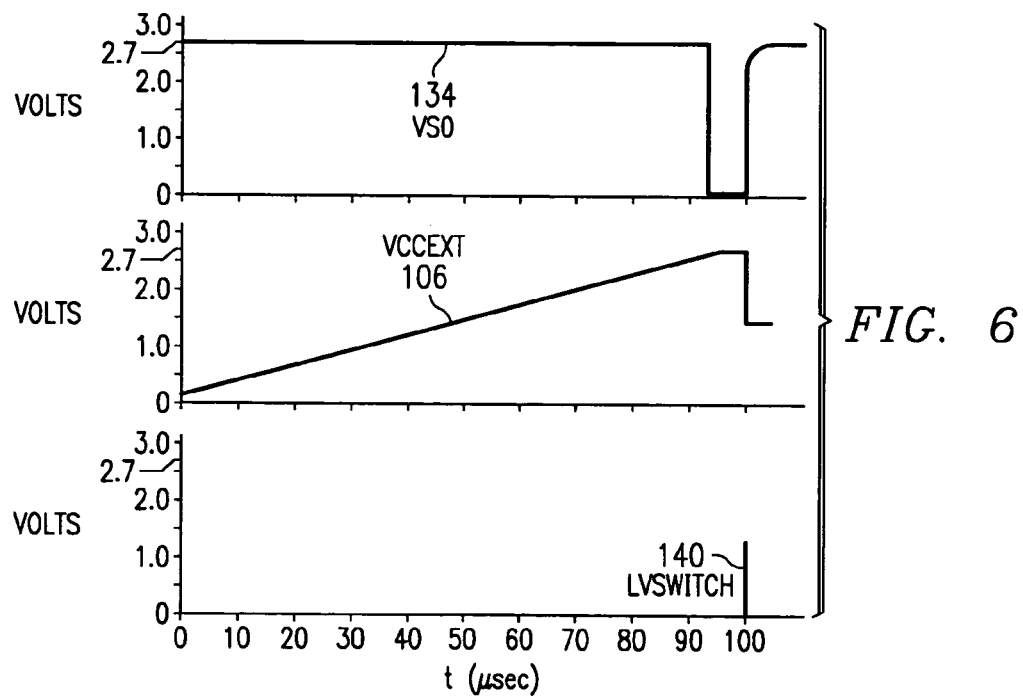

US 7,132,767 B2

METHOD AND CIRCUIT FOR SWITCHOVER BETWEEN A PRIMARY AND A SECONDARY POWER SOURCE

CROSS REFERENCE TO RELATED APPLICATIONS

This application is a divisional of U.S. application for patent Ser. No. 09/626,550, filed Jul. 27, 2000 now U.S. Pat. No. 6,787,938, the disclosure of which is hereby incorporated by reference.

BACKGROUND OF THE PRESENT INVENTION

1. Field of the Invention

The present invention generally relates to circuitry for protection of data stored within volatile devices, and more specifically, relates to circuitry capable of reacting to a fast negative transition of a supply level from a primary power source for initiating a switchover from the primary power source to a secondary power source.

2. Description of the Related Art

Volatile devices require power to maintain stored data. If power is removed from the volatile devices, the stored data is lost. Such volatile devices include volatile memory, clocks, and any other device that will lose the data upon the loss of power.

Conventional systems generally contain power source switchover circuitry for detecting that a supply level from a primary power source decreases below a threshold voltage and for initiating a switchover to a secondary or backup power source. The switchover to the secondary power source maintains power to the volatile elements to avoid loss of the stored data. However, the power source switchover circuitry utilized to switch from the primary power source to the secondary power source in conventional systems is designed to be stable over temperature and process corners, and not designed to respond to a fast ramp-down or negative transition of the supply level of the primary power source.

System designers have recently been interested in designing systems capable of performing a fast ramp-down of the primary power source. This presents a problem as the power source switchover circuitry in conventional systems cannot initiate a switchover from the primary source to the secondary power source for a fast ramp-down of the supply level of the primary power source (i.e., the fast ramp-down of the supply level is not detected by the power source switchover circuitry).

SUMMARY OF THE INVENTION

In order to perform a switchover from a primary power source to a secondary power source, for example to preserve stored data in memory elements, one must first detect that a problem exists with respect to the primary power source. The present invention addresses the need for a circuit to quickly respond to a fast ramp-down of the primary power source voltage and generate a control signal which can be used to drive a power source switch-over operation.

In accordance with an embodiment of the invention a pull-up and pull-down transistor pair is provided to monitor the state of the primary power supply voltage. Responsive to a drop in the voltage below a threshold, the pull-up/pull-down pair changes its state and drives an output transistor to generate the control signal which can be used to signal a switch-over between power sources. The level of the threshold depends on the pull exerted by the pull-up transistor.

An aspect of the invention relates to the inclusion of circuitry to adjust the pull exerted by the pull-up transistor and thus effectuate a change in the threshold level.

BRIEF DESCRIPTION OF THE DRAWINGS

A more complete understanding of the system, method, and apparatus of the present invention may be obtained by reference to the following Detailed Description when taken in conjunction with the accompanying Drawings wherein:

FIG. 5 is an exemplary flow diagram for providing a switchover from the primary power source to the secondary power source according to FIGS. 1 and 2A–2C; and FIG. 6 is an exemplary graph of a fast decrease of the signal level of the primary power source causing the switchover to the secondary power source according to FIGS. 1 and 2A–2C.

DETAILED DESCRIPTION OF THE DRAWINGS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Systems that utilize volatile elements, such as a volatile memory or clock to maintain stored data or current time, respectively, must provide a secondary power source to the volatile elements to avoid a loss of information from the volatile elements upon a power ramp-down from a primary power source. In order to protect the systems against loss of power to volatile elements, switchover circuitry for responding to ramp-down of the supply level of the primary power source is coupled to the volatile memory elements. Upon the supply level of the primary power source decreasing below a predefined threshold level, the switchover circuitry initiates a switchover from the primary power source to the secondary power source. A forced power source switchover circuit, which is included within the switchover circuitry according to the principles of the present invention, responds to a fast ramp-down of the supply level of the primary power source. The forced power source switchover circuit may be circuitry added in addition to a power source switchover circuit presently in the conventional systems. The forced power source switchover circuitry is fail-safe circuitry to force the switchover of the primary power source to the secondary power source. Upon the supply level of the primary power source reaching a trip point of the forced power source switchover circuitry, which is lower than the trip point of the power source switchover circuitry, the forced power source switchover circuitry 120 initiates a switchover from the primary power source to the secondary power source.

Figure 1:
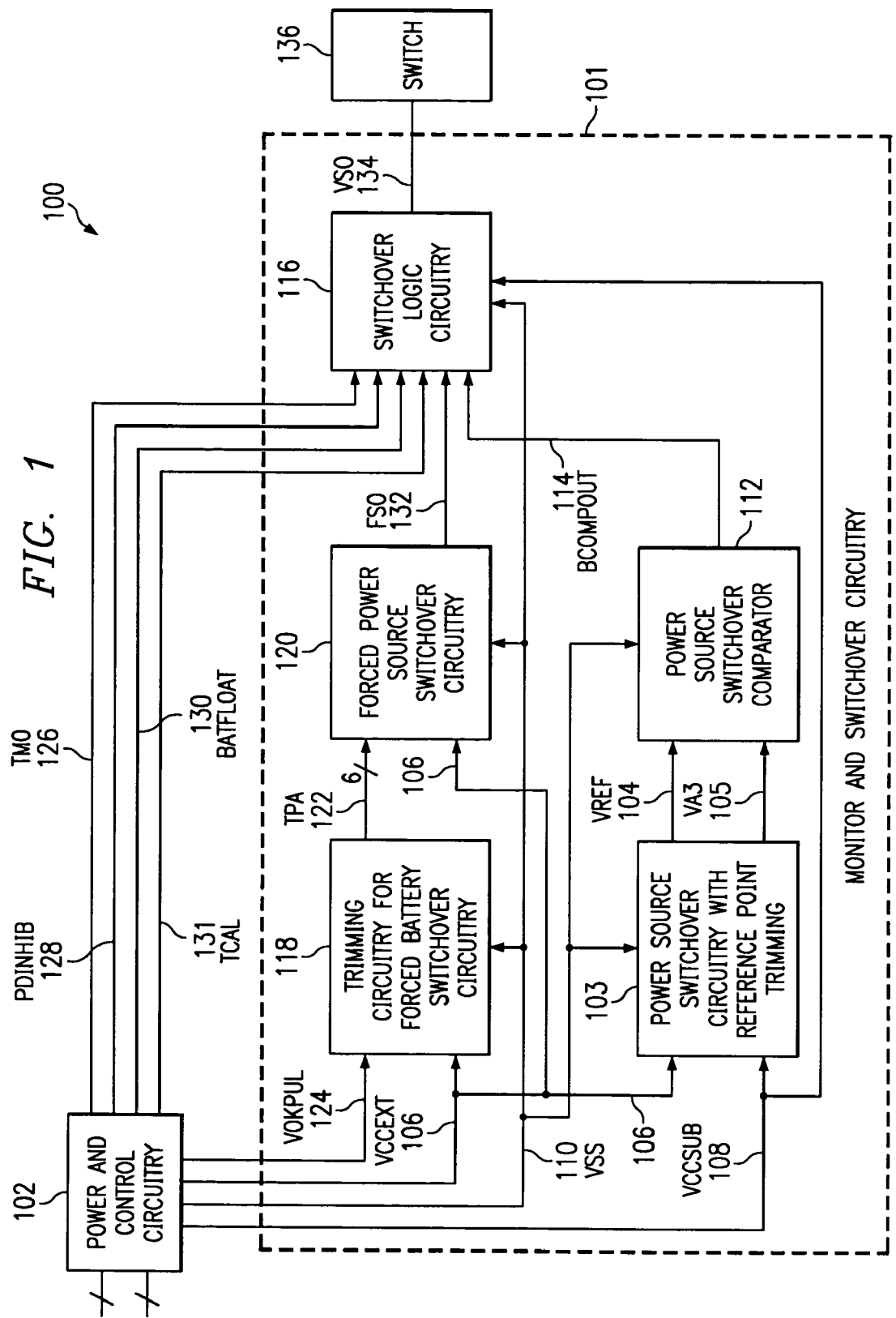
FIG. 1 is a high-level block diagram of a circuit to provide a switchover from a primary power source to a secondary power source.

FIG. 1 is a high level block diagram of circuitry to provide the switchover from the primary power source to the secondary power source. A portion of circuitry 100 of a system that provides and monitors power to the volatile devices within the system is shown. Monitor (i.e., detection) and switchover circuitry 101 is utilized for monitoring the power being delivered from the primary power source and switching to the secondary power source upon either the supply level of the primary power source transitioning below a first or a second voltage threshold. The second voltage threshold being reached if the supply level of the primary power source transitions faster than a predetermined negative rate of change (e.g., 150 microseconds). The power and control circuitry 102 receives and delivers power and control signaling to the monitor and switchover circuitry 101. Alternatively, the power and control circuitry may be included within the monitor and switchover circuitry 101.

Power source switchover circuitry 103 (having reference point trimming) has output signals VREF 104 and VA3 105, which are indication signals. The indication signals indicate the relative voltage levels of a supply level VCCEXT on line 106 from the primary power source (not shown) and the voltage potential of the substrate on line 108. It should be understood that the supply level of the primary power source may be received as either voltage or current. A reference level VSS on line 110 is received by the power source switchover circuitry 103, where VSS is generally ground.

A power source switchover comparator 112 receives the signals on the VREF line 104 and the VA3 line 105 as inputs. The power source switchover comparator 112 logically compares the input signals, VREF 104 and VA3 105. When the VREF signal 104 becomes lower than the VA3 signal 105 (i.e., supply level of the primary power source below the voltage potential of the substrate), then the output signal, BCOMPOUT 114, of the power source switchover comparator 112 becomes a high logic level. The BCOMPOUT signal 114 becoming a high logic level is a trigger for initiating a switchover from the primary to the secondary power source. It should be understood that the comparator 112 may be included within the power source switchover circuitry 103.

Switchover logic circuitry 116 receives the BCOMPOUT signal 114 as an input signal. The BCOMPOUT signal 114 is one input signal that the switchover logic circuitry 116 utilizes in initiating the switchover from the primary power source to the secondary power source.

Trimming circuitry 118 is connected to forced battery switchover circuitry 120. The trimming circuitry 118 connects to the forced power source switchover circuitry 120 via a trip point adjustment (TPA) bus 122. The trimming circuitry 118 receives a supply level from the primary power source via the power and control circuitry 102. Additionally, a pulse signal, VOKPUL 124, is received by the trimming circuit 118 for post-trimming functionality. The trimming circuitry 118 is used to adjust a trip point for the forced battery switchover circuitry 120 to provide an indication signal. The forced power source switchover circuitry 120 is capable of detecting the ramp-down of the primary power source at a rate faster than a predetermined negative rate of change. The trip point is generally trimmed for 2.0 volts at 85 Celsius, which will be raised by 400 millivolts at zero Celsius to become 2.4 volts.

The power and control circuitry 102, again, is used for delivering the supply levels of the power sources and control signals to the monitor and switchover circuitry 101. The control signals are generally used for configuring the switchover logic circuitry 116 in various states. Primarily, the states that the switchover logic circuitry 116 are configured include normal operating mode and trimming mode. The control signals include TM0 126, PDINHIB 128, BATFLOAT 130, and TCAL 131. By setting these control signals to particular logic levels, the switchover logic circuitry 116 is responsive to the BCOMPOUT signal 114 from the power source switchover comparator 112 and a forced switchover signal (FSO) 132 from the forced battery switchover circuitry 120. A voltage switchover signal (VSO) 134 is an output from the switchover logic circuitry 116. The VSO signal 134 is delivered to a switch circuit 136, which switches the supply signal (i.e., power source) being applied to the volatile elements to protect against data loss.

As previously described, the monitor and switchover circuitry 101 is capable of two modes, normal operating mode and trimming mode. The trimming mode includes two different trimming modes. The first trimming mode is for setting a crossover level (i.e., trip point) between the VREF signal 104 and the VA3 signal 105 as detected by the power source switchover circuitry 103. The second trimming mode is for setting a trip point for the forced battery switchover circuitry 120. Both of these trimming modes are selectable by applying the control signals in particular states so that the switchover logic circuitry 116 responds either to the BCOMPOUT signal 114 or the FSO signal 132. The VSO signal 134 can be monitored by a special pad to determine the state of either the BCOMPOUT signal 114 or the FSO signal 132 being received by the switchover logic circuitry 116. Once the trimming operations are completed, the monitor and switchover circuitry 101 is configured in the normal operating mode, which monitors the signal level being received from the primary power source and switching over to the secondary power source upon the supply level from the primary power source transitioning below the trip points as set during the trimming mode. The normal operating mode and the trimming modes will be described in more detail with reference to FIGS. 2A–2C.

Figure 2A:
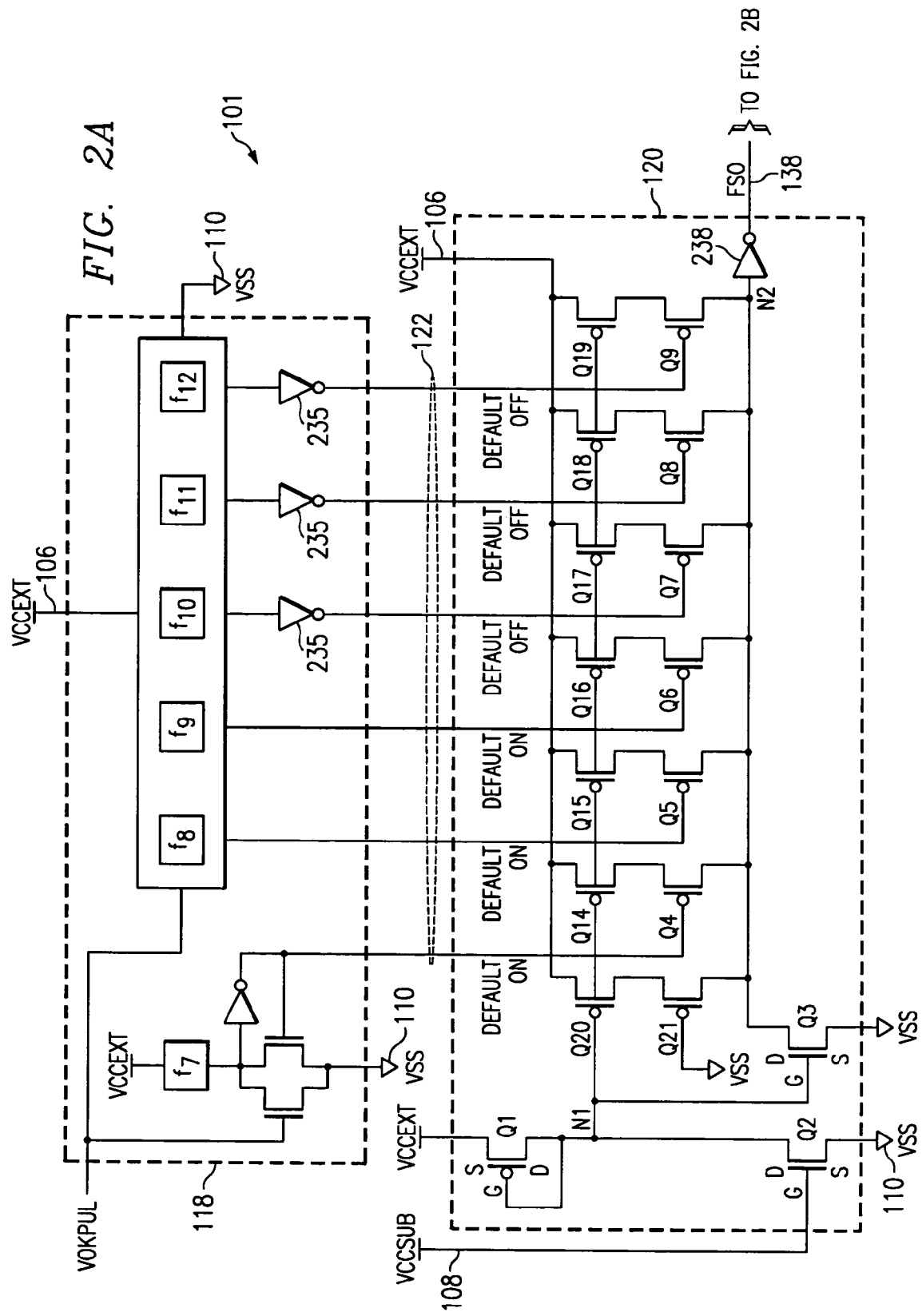
FIGS. 2A–2C illustrate an exemplary circuit as structured according to FIG. 1.
Figure 2B:
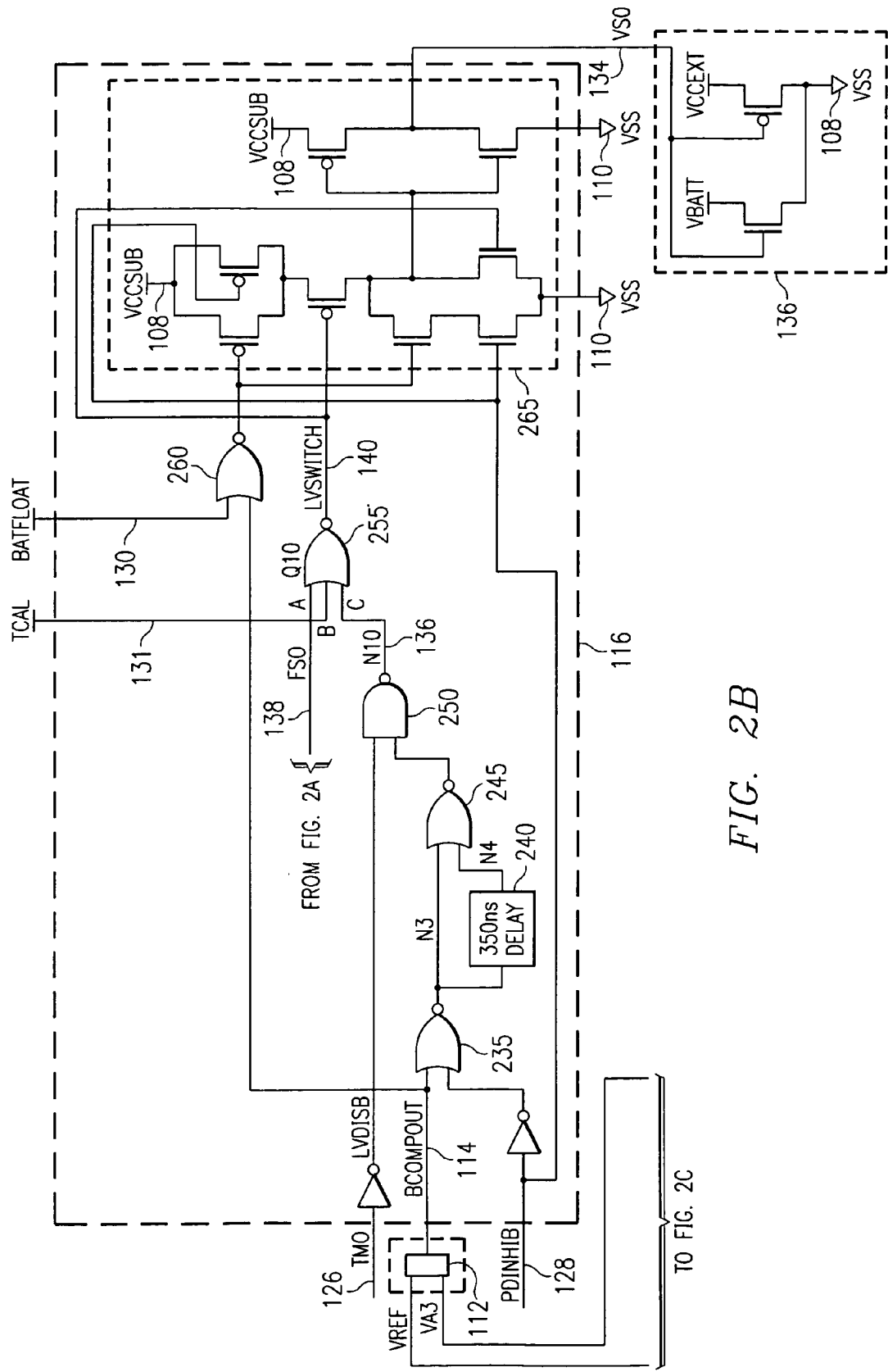
Figure 2C:
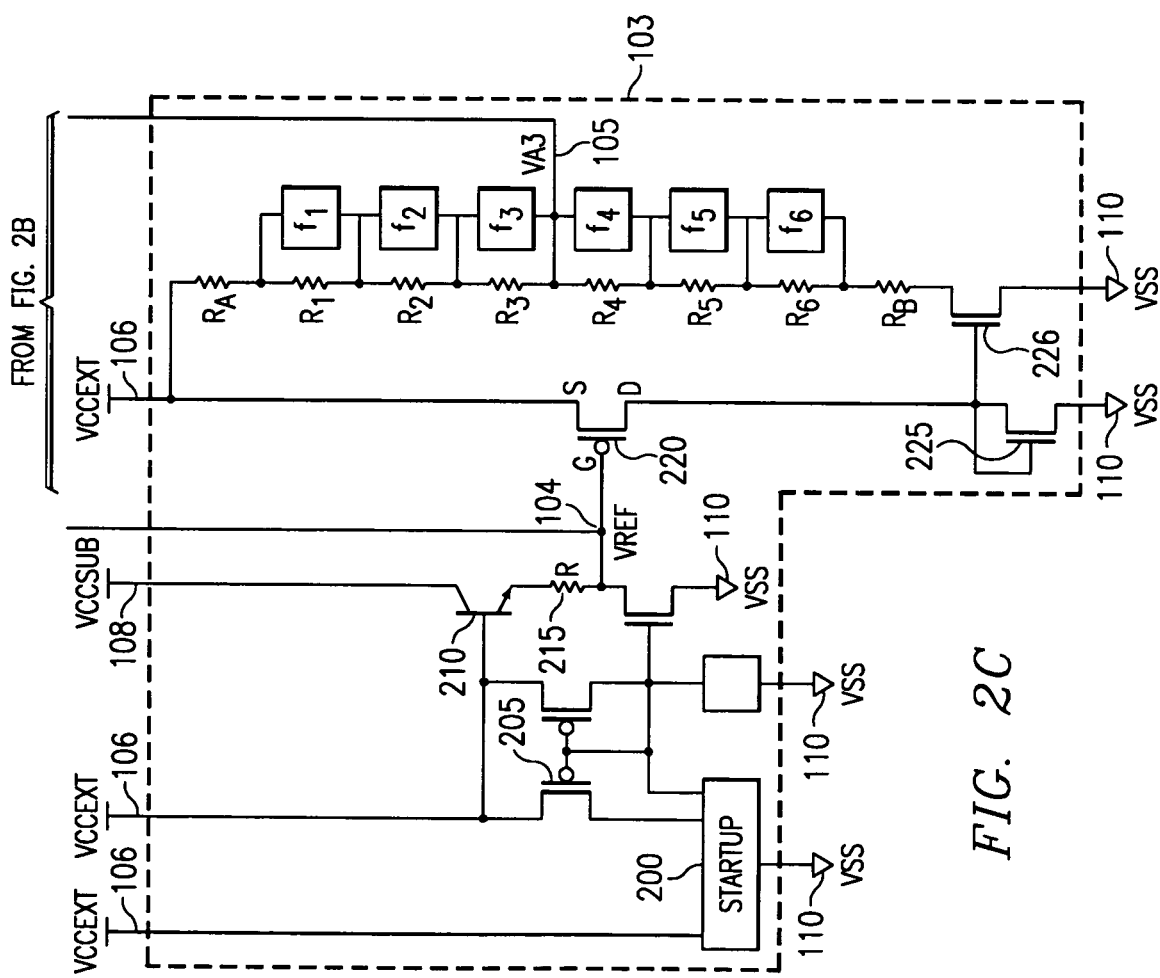

FIGS. 2A–2C illustrate one embodiment for a circuit level representation of the monitor and switchover circuitry 101 according to the principles of the present invention. Dashed boxes around the various circuit elements represent each of the blocks shown in FIG. 1, including the power source switchover circuitry 103, the switchover comparator 112, the trimming circuitry 118, the forced battery switchover circuitry 120, and the switchover logic circuitry 116.

When configured for normal operation, in general, the combination of the power source switchover circuitry 103 and comparator 112 detect when the primary power source drops below the trip point or predefined threshold level (e.g., 2.5 volts) of the power source switchover circuitry 103 and provide an indication signal BCOMPOUT 114 to the switchover logic circuitry 116 for switching from the primary power source to the secondary power source. However, the power source switchover circuitry 103 is not capable of reacting to fast ramp-down rates of supply level of the primary power source, but maintains a stable trip point over temperature variations. To provide for a power source switchover for fast ramp-down of the supply level from the primary power source, the forced power source switchover circuitry 120 is designed to provide an indication or fast switchover signal (FSO) 138 to the switchover logic circuitry 116. While the forced power source switchover circuitry 120 is capable of reacting to a fast ramp-down of the supply level from the primary power source, the trip point of the forced power source switchover circuitry 120 varies over temperature. The FSO signal 138 forces a switchover from the primary power source to the secondary power source upon the supply level of the primary power source reaching the trip point set during the trimming mode for the forced power source switchover circuitry 120 that is set below the trip point of the power source switchover circuitry 103. The switchover logic circuitry 116 contains circuitry for responding to the indication signals, BCOMPOUT 114 and FSO 132, and asserting the switchover from the primary power source to the secondary power source.

Specifically, the power source switchover circuitry 103 detects a ramp-up of the supply level of the primary power source. The detection is performed primarily by transistor 210 and indicated by the VREF signal 104. The signal level (VCCEXT 106) of the primary power source is indicated by the VA3 signal 105. The VREF signal 104 is computed as VCCEXT 106 minus the voltage drop of the base to emitter of the bipolar transistor 210 minus the voltage drop across the resistor 215. The VA3 signal 105 is an indication of the voltage level of VCCEXT 106. The comparator 112 compares the VREF signal 104 and the VA3 signal 103. If the VREF signal 104 is above the VA3 signal 105, then the primary power source is utilized to supply power to the volatile elements. Upon the VREF signal 104 transitioning below the VA3 signal 105, the switchover from the primary power source to the secondary power source is initiated by the switchover logic circuitry 116.

The volatile elements (not shown) are specified to operate at 2.6 volts by system designers. Additionally, the system designers specify that the internal backup battery is to last for ten years. In order for the battery to last for ten years, the battery cannot be required to supply more than 600 nanoamps to operate the volatile elements (e.g., random access memory). For example, to perform standard read and write operations for a random access memory, 20 milliamps are drawn from a power source. At that rate, the battery would only be able to supply the RAM for approximately one second. So, if a battery is used for the secondary power source, it can only be used to maintain the contents of the volatile elements and not to perform standard read and write operations.

To meet the above specifications, it is desired that the supply level being received from the primary power source be switched to being received from the secondary power source and vice versa when the supply level from the primary power source crosses the predefined threshold level of the power source switchover circuitry 103. The predefined threshold level of the power source switchover circuitry 103 is generally below a minimum operating level (i.e., 2.6 volts) of the volatile elements. The preferred embodiment has its predefined threshold level set to 2.5 volts, but other levels are possible.

The power source switchover circuitry 103 contains startup circuitry 200 coupled to the VCCEXT line 106 and current mirror circuitry 205. The current mirror circuitry is coupled to the base of the transistor 210, which has its collector connected to the VCCSUB line 108 and its emitter connected to a resistor 215. The other terminal of the resistor is connected to a gate of a P-channel transistor 220. The line connecting the resistor 215 and the gate of the P-channel transistor 220 provides the VREF signal 104. The source of the P-channel transistor 220 is coupled to VCCEXT 106 and the drain is coupled to the gates of two N-channel transistors 225 and 226, which have their source terminals connected to VSS 110. Coupled between the source terminal of the P-channel transistor 220 and the drain channel of the N-channel transistor 226 are a series of resistors, RA, R1–R6, and RB, which form a voltage divider. A node coupled between the R3 and the R4 resistor provides the VA3 signal 105. In parallel to each of the resistors R1–R6 are fuses f1–f6, respectively, that are used to adjust or trim the value of the voltage divider, which generates the VA3 signal 103.

When ramping-up the primary power source, the VCCEXT signal 106 provides a boost to the startup circuitry, which causes the current mirror circuitry 205 to operate. Upon the base terminal receiving current flow, the transistor 210 will begin to lower the impedance across its collector and emitter terminals and a voltage level is developed at the VREF node 104. Simultaneously, a voltage is developed at the VA3 node 105 as dictated by the voltage divider from the resistors RA, R1–R6, and RB taking into account the status of fuses f1–f6. At the trip point, the voltage level of the VREF signal 104 and the VA3 signal 105 cross as the VREF signal 104 has a steeper slope than the VA3 signal 105. The trip point for the power source switchover circuitry 103 and is generally set for 2.5 volts. It should be noted that during the time that the monitor and switchover circuitry 101 is powered on the secondary power source, such as a battery, the substrate is at the level of the secondary power source, such as 3V. When the substrate is powered by the secondary power source at 3V, all of the P-channel transistors are in a weak inversion state (i.e., back bias mode) until the switchover from the secondary to the primary power source occurs and the voltage potential of the substrate drops to the supply level of the primary power source.

Figure 3:
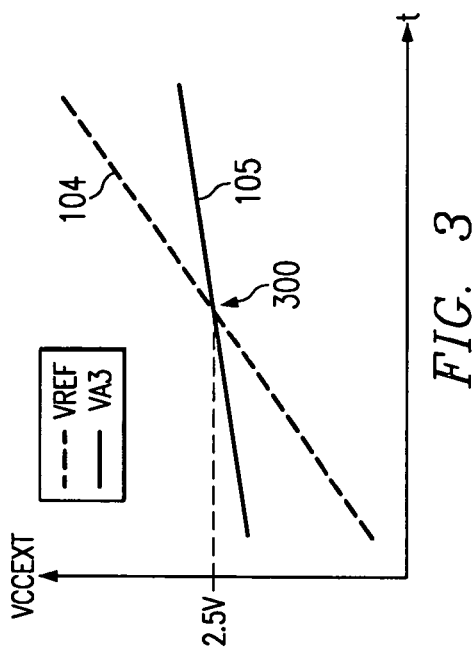
FIG. 3 is an exemplary graph of the output signals of the power source switchover circuitry according to FIG. 2A–2C.

Referring to FIG. 3, an exemplary graph of the output signals of the power source switchover circuitry 103 is shown. As shown, the VREF signal 104 has a steeper slope than the VA3 signal 105. The point where the VREF signal 104 crosses the VA3 signal 105 is trip point 300 for the power source switchover circuit. The trip point 300 is generally trimmed to occur at 2.5 volts. However, the trip point 300 can be trimmed for other voltages by selectively blowing fuses f1–f6 to create different voltage divider values. To raise the trip point 300, any combination of fuses f4–f6 are blown, and to lower the trip point 300, any combination of f1–f3 are blown. It should be noted that the trip point occurs at the same voltage level whether the primary power source is ramping up or ramping down and the trip point varies minimally over temperature.

Referring again to FIGS. 2A–2C, at the trip point 300, the BCOMPOUT signal 114 switches from a high to a low logic level when the primary power source is ramping up. It should be noted that the VREF signal 104 is equal to the VCCEXT 106 minus approximately 1.2 volts, which is the result of the voltage drop of the transistor 210 and the voltage drop across the resistor 215.

The forced power source switchover circuitry 120 includes a P-channel transistor Q1, two N-channel transistors Q2 and Q3, and a multiple number of P-channel transistors Q4–Q9 and Q14–Q21. The source terminal of the P-channel transistor Q1 is connected to VCCEXT 106 (i.e., the primary power source) and the gate and drain terminals are tied together. The drain terminal of the P-channel transistor Q1 is connected to the drain terminal of the N-channel transistor Q2. The node formed by the drain terminals of Q1 and Q2 is designated node N1 and is further connected to the gate terminal of the N-channel transistor Q3. The source terminal of the N-channel Q2 is connected to VSS 110 (i.e., ground) and the gate terminal is connected to VCCSUB 108. The source terminal of the N-channel transistor Q3 is connected to VSS 110 and the drain terminal of the N-channel transistor Q3, designated as node N2, connects to the drain terminals of Q4–Q9 and Q21. Additionally, the node N1 is coupled to the gate terminals of the P-channel transistors Q14–Q20. The source terminals of the P-channel transistors Q14–Q20 are connected to the VCCEXT line 106. The gate terminals of Q4–Q9 are connected to the trip point adjustment bus 122, which is coupled to circuitry within the trimming circuitry 118. Finally, an inverter 230 has its input connected to the node N2 and outputs the forced switchover signal (FSO) 138.

In operation, the forced power source switchover circuitry 120 operates to force a switchover from the primary power source to the secondary power source upon the supply level of the primary power source transitioning below a predefined threshold level (e.g., 2.0 volts). The configuration of Q1, Q2, and Q3 functions to react to a fast transition of the supply level of the primary power source. The forced power source switchover circuitry 120 is designed to have its trip point at 2.0 volts at a temperature of 85 Celsius, which is raised by 400 millivolts at zero Celsius to become 2.4 volts.

The configuration of Q1, Q2, and Q3 operates in the following manner. Upon VCCEXT 106 transitioning below 2V, Q1 does not receive enough voltage to be turned on, so Q2 pulls node N1 low. Upon node N1 going low, node N2 transitions from a low to a high due to the VCCEXT signal 106 becoming coupled through at least the P-channel transistors Q20 and Q21. Additionally, depending upon the trimming circuitry 118 configuration, the VCCEXT signal 106 may be coupled through transistor pairs Q14/Q4, Q15/Q5, Q16/Q6, Q17/Q7, Q18/Q8, and Q19/Q9. Also, Q14–Q19 track with Q1 across the process variations.

As was the case with the power source switchover circuitry, the P-channel transistors in the forced power switchover circuitry 120 are in back bias mode because the VCCEXT 106 is low and the substrate has the voltage potential approximately equal to the supply level of the secondary power source, which is essentially 3V when using a battery. Because the P-channel transistor Q1 is in a weakened state when the secondary power source is supplying the monitor and switchover circuitry 101, the N-channel transistor Q2 has a strong influence over node N1. The P-channel transistor Q1 is in a weakened state while VCCEXT 106 is below 2.5V (i.e., the trip point of the power source switchover circuitry 103). Upon the switchover to the primary power source, the substrate drops to the supply level of VCCEXT 106 in approximately 50 nanoseconds and the P-channel transistor Q1 transitions into a normal operating state.

The triming circuitry 118 comprises circuitry for enabling and disabling the P-channel transistors Q4–Q9. As configured, the transistors Q4–Q6 are defaulted on and the transistors Q7–Q9 are defaulted off. As shown, fuses f7–f12 are used for trimming to set the voltage levels of the trip point adjustment bus 122. For example, for P-channel transistor Q4, if the fuse f7 is blown, then the input to the gate of the P-channel transistor Q4 becomes a high logic level, which turns off the P-channel transistor Q4. The circuitry accompanying fuses f8–f12 have the same circuitry (i.e., the parallel N-channel transistors and inverter) connected to fuse f7; however, inverters 235 are included on the output of the circuitry accompanying fuses f10–f12 so that the default of P-channel transistors Q7–Q9 are off.

The forced power switchover circuitry 120 has its trip point set at 2.0 volts, as previously discussed. To make a stronger or weaker pull-up for the P-channel transistor Q1, the fuses f7–f12 are blown. To decrease the trip point, fuses f7–f9 may be blown, and to increase the trip point, fuses f10–f12 may be blown. It should be understood that the trip point may need adjustment due to process deviations when fabricating the integrated circuit. When the voltage potential of VCCSUB 108 crosses the supply level of VCCEXT 106, P-channel transistor Q1 in conjunction with N-channel transistor Q3 cause the FSO signal 138 to transition from low to high at 2V, for example.

Thus far, the power source switchover circuitry 103 and the forced power source switchover circuitry 120 have been discussed for both normal operating mode and trimming mode. To fully understand the operation of the monitor and switchover circuitry 101, however, the integration of the power source switchover circuitry 103 and the forced power source switchover circuitry 120 with the switchover logic circuitry 116 must be discussed. The switchover logic circuitry 116 is utilized for configuring the monitor and circuitry 101 to operate in normal operating mode and trimming modes.

The switchover logic circuitry 116 comprises logic gates, a delay element, and transistors configured as logical elements. These components are configured to receive the control signals from the power and control circuitry 102, including TM0 126, PDINHIB 128, BATFLOAT 130, and TCAL 131. The two switchover indicators, BCOMPOUT 114 and FSO 138, are also received by the switchover logic circuitry 116. As previously discussed, the monitor and switchover circuitry 101 operates in two modes, normal operating mode and trimming mode. In the normal operating mode, each of the control signals are forced to a low logic levels when the primary power source is driving the monitor and switchover circuitry 101. In the trimming mode, the control signals are configured to (1) ignore the FSO signal 138 so that the transition of the BCOMPOUT signal 114 can be detected for trimming the power source switchover circuitry 103, and (2) ignore the BCOMPOUT signal 114 so that the transition of the FSO signal 138 can be detected for trimming the forced power source switchover circuitry 120. By selectively detecting each of the switchover signals (i.e., BCOMPOUT 114 and FSO 138), trimming of the trip points of the power source switchover circuitry 103 and the forced power source switchover circuitry 118 can be performed on a single test station. Once each of the trip points have been measured, the trip point of the power source switchover circuitry 103 measured on the positive transition of the supply level of the primary power source and the trip point of the forced power source switchover circuitry 120 measured on the negative transition of the supply level of the primary power source, for example, then the appropriate fuses can be blown to adjust the trip points.

Normal Operating Mode

There are three conditions that can occur in the normal operating mode. First condition: the monitor and switchover circuitry 101 can be receiving power from the secondary power source and the primary power source can transition from a low to a high power level. Second condition: the primary power source can be supplying the monitor and switchover circuitry 101 with a normal operating power level and transition to a low power level at a rate slower than a predetermined rate of change. Third condition: the primary power source can be supplying the monitor and switchover circuitry 101 with the normal operating power level and transition to a low power level, the transition occurring at a rate faster than a predetermined rate of change.

The first condition of the normal operating mode detects transitions of the signal level of the primary power source from a low to a high signal level. The VREF signal 104 will cross the VA3 signal 105 at the trip point of the power source switchover circuitry 103 as the supply voltage of the primary power source ramps-up. As previously discussed, the preferred embodiment sets the trip point of the power source switchover circuitry 103 to 2.5V. At the trip point of the power source switchover circuitry 103, the BCOMPOUT signal 114 transitions from a high to a low logic level indicating that the VREF signal 104 is higher than the VA3 signal 105 (i.e., the primary power source is at a normal operating level). The transition of the BCOMPOUT signal 114 causes the monitor and switchover circuitry 101 to switch from the secondary power source to the primary power source. When the BCOMPOUT signal goes high, the output of the nor gate 235, node N3, transitions from a high to a low logic level. Node N3 is also an input to the delay element 240. The delay element 240 may comprise a plurality of delay components (e.g., inverters) within the delay element 240 to delay the input signal by 350 nanoseconds, for example. The output of the delay element 240, node N4, transitions 350 nanoseconds after the transition of node N3.

The purpose for delaying the high to low logic level transition of node N4 by 350 nanoseconds is the following: as the external power supply is ramped-up while the monitor and switchover circuitry 101 is in normal operating mode, the LVDISB signal is high (i.e., TM0 is low), and the BCOMPOUT signal 114 transitions to a low logic level at 2.5V. As soon as the BCOMPOUT signal 114 becomes a low logic level, the device is powered by the external power supply. If the secondary power supply is a battery, the battery creates a voltage potential on the substrate of approximately 3V. When the switchover from the secondary power source to the primary power source occurs, about 50 nanoseconds is necessary for the voltage potential on the substrate to transition from 3V to approximately 2.5V, which is the trimmed reference of the power source switchover circuitry 103. Until the substrate settles at 2.5V, all the P-channel transistors are in back bias mode and the secondary trip point produces an unwanted hysteresis, which is a second trip point at a higher value (e.g., 2.9V). By delaying node N4 (and node N10) from transitioning for 350 nanoseconds, the 50 nanosecond transition requirement for the substrate to drop from 3V to 2.5V is satisfied and any unwanted transitions of the FSO signal 138 during the transition of the voltage potential on the substrate are ignored. Upon the voltage potential of the substrate transitioning to the supply level of the primary power source, the trip point of the forced power source switchover circuitry 120 becomes 2.0V at 85 C and the power source switchover circuitry 120 starts to operate in normal mode (i.e., the P-channel transistors are no longer in back bias mode).

Continuing with the transition of the primary power source from low to high in the normal operating mode, when both the N3 and the N4 nodes are low, the nor gate 245 outputs a high logic level, which causes both of the inputs to nand gate 250 to be high and driving the output of the nand gate 250 to be low. The output of the nand gate 250 is node N10 136 (also indicated as input terminal C into nor gate 255). However, since the FSO signal 138 on node A of the nor gate Q10 is a high logic level, the output, LVSWITCH 140 of the nor gate Q10 remains low. As PDINHIB 128 transitions from high to low upon the primary power source becoming powered-up, a low logic level is applied to output stage 265, which becomes configured to transition the VSO signal 134 to a low logic level. The VSO signal 134 being a low logic level transitions the switch 136 to apply the primary power source (i.e., VCCEXT 106) to the volatile elements.

The second condition of the normal operating mode occurs when the primary power source is sourcing the monitor and switchover circuitry 101 with a steady-state signal level and decreasing the signal level below a predefined threshold level, the decrease occurring at a rate slower than a predetermined negative rate of change (e.g., more than 150 microseconds). This condition operates in a similar manner as the circuitry in the conventional systems as the power source switchover circuitry 103 is capable of detecting the decrease of the signal level of the primary power source.

Upon the power source switchover circuitry 103 detecting the signal level of the primary power source transitioning below the trip point (i.e., approximately 2.5V), the BCOMPOUT signal 114 transitions from a low to a high logic level. The LVSWITCH signal 140 remains a logic low during the slow ramp-down as the FSO signal 138 remains a high logic level. The output of the nor gate 260 transitions from a high to a low logic level, which causes the VSO signal 134 to transition to a low logic level and the switch 136 to switch the secondary power source to the supply the non-volatile elements.

The third condition of the normal operating mode allows the system designer to increase the ramp-down of the primary power source and not lose stored data in volatile elements. As discussed earlier, the fast ramp-down (e.g., faster than 150 microseconds) is not detected by the power source switchover circuitry 103 so that the BCOMPOUT signal 114 does not transition from a low logic level to initiate a switchover to the secondary power source as the signal level of the primary power source crosses the trip point of the power source switchover circuitry 103.

Upon the signal level of the primary power source crossing the trip point of the forced power source switchover circuitry 120, the FSO signal 138 transitions from a high to a low logic level. The transition of the FSO signal 138 is produced by the configuration of the transistors Q1, Q2, and Q3 as previously discussed. Because the other two input terminals (i.e., TCAL and node N10) to the nor gate 255 remain low, the transition of the FSO signal 138 to a low logic level causes the LVSWITCH signal 140 to become a high logic level and the VSO signal 134 to become a high logic level. The VSO signal 134 becoming a high logic level, in turn, causes the switch 136 to switch from the primary power source to the secondary power source. The monitor and switchover circuitry 101 receives the signal level of the secondary power source and the volatile element does not lose stored data. Because the forced power source switchover circuitry 120 initiates the switchover extremely quickly, there is no danger of the volatile elements losing the stored data.

Trimming Modes

Prior to setting the monitor and switchover circuitry 101 in the normal operating mode, both the power source switchover circuitry 103 and the forced battery switchover circuitry 120 are configured or trimmed to set the trip points (i.e., the signal level of the primary power source that each circuit indicates a switchover). As previously discussed, the trip point of the power source switchover circuitry 103 (i.e., primary trip point) is set to approximately 2.5V and the trip point of the forced power source switchover circuitry 120 (i.e., secondary trip point) is set to 2.0V. Although the trimming operation of the individual circuits has previously been discussed, the following includes configuring the switchover logic circuitry 116 to react only to one or the other circuits (i.e., detect either the BCOMPOUT signal 114 or the FSO signal 132).

To configure the switchover logic circuitry 116 for monitoring the trimming operation of the power source switchover circuitry 103, the TM0 control signal 126 is set to a high logic level. By setting the TM0 control signal 126 high, LVDISB is low and node N10 136 is high, forcing LVSWITCH 140 low so that the FSO signal 138 is effectively ignored by the output stage 265. Upon the primary power source ramping up (or down), the BCOMPOUT signal 114 transitions when crossing the trip point of the power source switchover circuitry 103. In the case of the primary power source ramping-up, the nor gate 260 outputs a low logic level to the output stage 265 and the VSO signal 134 transitions from a high to a low logic level, which causes the switch to apply the VCCEXT signal to the substrate. The substrate can be monitored to determine the trip point of the power source switchover circuitry 103 and appropriate trimming can be performed by blowing any combination of fuses f1–f6.

To configure the switchover logic circuitry 116 for monitoring the trimming operation of the forced power source switchover circuitry 103, the BATFLOAT control signal 130 is set to a high logic level and TM0 is set to a logic low logic level. The BCOMPOUT signal is therefore effectively ignored. When the signal level of the primary power source decreases below the trip point of the forced power source switchover circuitry 103, the FSO signal 138 transitions from a high to a low logic level, which causes the LVSWITCH signal 140 and the VSO signal 134 to transition from a low to a high logic level. The switch 136 applies the secondary power source to the substrate upon the VSO signal 134 becoming a high logic level. The substrate can be monitored to determine the trip point of the forced power source switchover circuitry 120. Trimming of the fuses f7–f12 can be adjusts the trip point of the forced power source switchover circuitry 120.

Figure 4:
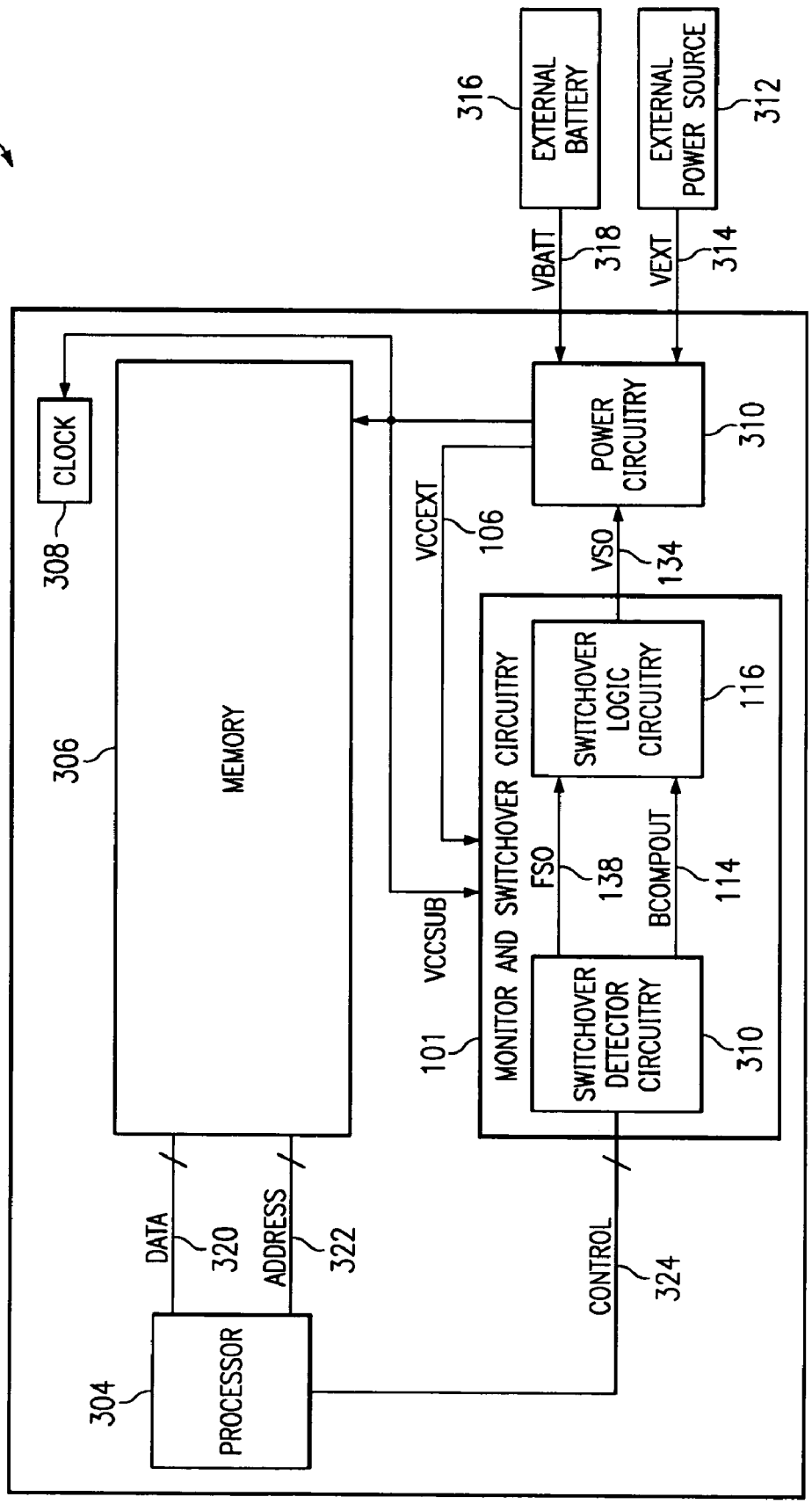
FIG. 4 is an exemplary system block diagram having volatile elements and circuitry to provide a switchover as provided by FIGS. 1 and 2A–2C.

FIG. 4 is an exemplary system 300 that includes the power source switchover circuitry according to the principles of the present invention. The exemplary system 300 includes a processor 304, the monitor and switchover circuitry 101, a memory 306, a clock 308, and power circuitry 310. The power circuitry 310, which may include power regulation circuitry (not shown), is connected to an external power source 312 providing Vext 314 to the power circuitry and to an external battery 316 providing Vbatt 318 to the power circuitry. The primary and secondary power sources may be external, internal, or a combination of external and internal power sources.

In addition to the processor 304 providing functionality to the system 300, the processor 304 interfaces with the memory 306 and the monitor and switchover circuitry 101. The processor is connected to the memory 306 via a data bus 320 and an address bus 322. The processor is further connected to the monitor and switchover circuitry 101 via a control bus 324 to provide control information to the monitor and switchover circuitry 101. The control bus 324 may include mode information to, for example, place the monitor and switchover circuitry 101 in test mode or in normal operating mode.

The monitor and switchover circuitry 101 includes switchover detector circuitry 310 and the switchover logic circuitry. Although not shown, the switchover detector circuitry includes the elements of the monitor and switchover circuitry 101 excluding the switchover logic circuitry 116. The switchover detector circuitry outputs two switchover indicator signals, BCOMPOUT 114 and FSO 138, which indicate that the supply level of the primary power source is above or below a predefined threshold level.

The power circuitry 310 receives the power for the system 300 and delivers the power to the other components within the system 300. The power circuitry 310 is controlled via the VSO signal 134, which initiates a switch from the external power source 312 to the external battery 316 if the supply level Vext 314 of the external power source 312 drops below a predefined threshold. The memory 306 and the clock 308 are volatile elements, so both are prevented from losing power during a supply level decrease, either slower or faster than a predetermined negative rate of change, via the monitor and switchover circuitry 101 as described with reference to FIGS. 1 and 2A–2C.

The system 300 may be a self-contained unit, such as a communication device, a computing device, or a clock. Examples of a communication device include: a mobile telephone, a personal communicator, and a pager. Examples of a computing device include: a personal computer, a portable computer, a hand-held computer, and a calculator. It should be understood that the principles of the present invention may be applied to any system or device that includes volatile elements and is not limited to the exemplary systems as herein presented.

Referring to FIG. 5, an exemplary flow diagram 500 of the process for performing a power source switchover within a system according to the principles of the present invention is presented. The process starts in normal operating mode at step 505 and power from the primary power source is applied at step 510. Prior to the primary power source applying power at step 510, the system may be receiving power from a secondary power source.

At step 515, a determination is made as to whether the power from the primary power source has dropped below a predefined threshold level. The predefined threshold level is set in a trimming mode, generally at a substrate level, prior to starting the normal operating mode. The determination 515 is performed by the monitor and switchover circuitry 101. Within the monitor and switchover circuitry 101, both the power source switchover circuitry 103 combined with the power source switchover comparator 112 and the forced power source switchover circuitry 120 act to perform the determination 515. If the determination is negative, then the system continues to monitor the supply level of the primary power source by effectively looping the step of determining 515. If the determination is positive (i.e., a determination has been made that the supply level of the primary power source has dropped below a predefined threshold level), then a switchover signal based upon a negative rate of change of the supply level is applied at step 520. If the supply level of the primary power source drops slower than a predetermined negative rate of change (e.g., 150 microseconds), then the switchover signal (i.e., BCOMPOUT 114) is applied by the power source switchover comparator 112. If the supply level of the primary power source drops faster than the predetermined negative rate of change, then the switchover signal (i.e., FSO) is applied from the forced battery switchover circuitry 120. It should be understood that both the power source switchover circuitry 103 and the forced battery switchover circuitry 120 are performing the steps of determining 515 and applying 520 according to the present example.

At step 525, a detection for determining that the switchover signal has been applied is performed. Upon the detection 525 occurring, a switchover from the primary to the secondary power source is performed at step 530. The switchover 530 occurs before the volatile elements lose the stored data.

At step 535, a determination is made as to whether the supply level of the primary power source has returned above the predefined threshold level. If the determination 535 is negative, then the process continues to monitor the supply level of the primary power source. Upon the supply level of the primary power source returning above the predefined threshold level, the power from primary power source is applied to the system at step 510. The determination 535 is performed by the power source switchover circuitry 103 in combination with the switchover logic circuitry 116.

Referring to FIG. 6, three exemplary waveforms illustrate the normal operating mode of the monitor and switchover circuitry. The waveforms illustrate both ramp-up and fast ramp-down of the primary power source having a voltage of VCCEXT 106. Initially, the VSO signal 134 indicates that the system is receiving power by the secondary power source as the VSO signal is high. Upon the signal level of the primary power source reaching 2.6V, the VSO signal becomes a low logic level, which causes the switch 136 to switch from the secondary power source to the primary power source.

At 100 microseconds, the VCCEXT signal 106 is decreased to 1.4V within 25 nanoseconds, which causes the forced power source switchover circuitry 120 to react. Upon the VCCEXT signal 106 reaching 2.0V, the FSO signal 138 (not shown) becomes low, which triggers the LVSWITCH signal 140 to become high. Upon the LVSWITCH signal 140 becoming high, the VSO signal, again, becomes high, which causes the switch 136 to switch from the primary power source to the secondary power source and the stored data in the volatile elements to be maintained.

It should be understood that the monitor and switchover circuitry may be incorporated into a single integrated circuit or may be included on multiple integrated circuits. While the exemplary circuitry presented utilizes specific logic gates, it is contemplated that the principles of the present invention could allow for other logic gates to be utilized and produce the same or similar functionality as herein presented.

The previous description is of a preferred embodiment for implementing the invention, and the scope of the invention should not necessarily be limited by this description. The scope of the present invention is instead defined by the following claims.

What is claimed is:

1. A circuit for providing an indication that a signal level of a primary power source transitions below a predefined threshold level, the circuit comprising:
   a first transistor electrically coupled to a second transistor, a common node being formed along the coupling which includes drain/source circuits of the first and second transistors;
   a third transistor having a gate terminal coupled to the common node; and
   at least one pair of drain/source circuit series connected trimming transistors, a first transistor of the at least one pair of trimming transistors having a gate terminal coupled to the common node, the at least one pair of drain/source circuit series connected trimming transistors coupled in series to include a drain/source circuit of the third transistor.

2. The circuit according to claim 1, further including a fuse electrically coupled to a gate terminal of a second transistor of the at least one pair of trimming transistors, the fuse being blown to selectively turn on/off the second transistor of the at least one pair of trimming transistors.

3. The circuit according to claim 1, wherein the first transistor is coupled to the primary power source and a gate terminal of the second transistor is coupled to a substrate of the circuit.

4. A circuit, comprising:
   a first transistor having its source/drain terminals connected between a external power supply voltage and a first node;
   a second transistor having its source/drain terminals connected between the first node and a reference voltage, and further having a gate terminal connected to receive a substrate voltage related to a backup supply voltage; and
   a third transistor having its source/drain terminals connected between an output node and the reference voltage, and further having a gate terminal connected to the first node.

5. The circuit of claim 4 wherein the first transistor is a p-channel device and the second and third transistors are n-channel devices.

6. The circuit of claim 4 wherein the third transistor drives the output node to change state responsive to a drop in the external power supply voltage below a threshold value.

7. The circuit of claim 6 wherein the threshold value depends on a pull exerted by the first transistor.

8. The circuit of claim 7 further including circuitry for adjusting the pull exerted by the first transistor to effectuate a change in the threshold value.

9. The circuit of claim 8 wherein the circuitry comprises a pair of drain/source terminal series connected transistors which are connected between the external power supply voltage and the output node, a first one of the pair of transistors having its gate terminal connected to the first node and a second one of the pair of transistors having its gate terminal connected to receive a threshold voltage trim control signal.

10. The circuit of claim 8 wherein the circuitry comprises a plurality of pairs of drain/source terminal series connected transistors, each pair being connected between the external power supply voltage and the output node, a first one of the transistors in each pair having its gate terminal connected to the first node and a gate terminal of each second one of the transistors in each pair connected to receive its own threshold voltage trim control signal.

11. The circuit of claim 10 wherein a first subset of the plurality of pairs receive voltage trim control signals to drive the second transistors in each pair to a normally on condition and a second subset of the plurality of pairs receive voltage trim control signals to drive the second transistors in each pair to a normally off condition.

12. The circuit of claim 11 further including a trim selection circuit operable to selectively and individually configure the voltage trim control signals to change the normally on/off condition of the second transistors in each pair.

13. The circuit of claim 12 wherein the trim selection circuit comprises selectively blowable fuse circuitry.

14. The circuit of claim 4 further including pull up circuitry connected between the external power supply voltage and the output node.

15. The circuit of claim 14 wherein the pull up circuitry comprises a pair of drain/source terminal series connected transistors which are connected between the external power supply voltage and the output node, a first one of the pair of transistors having its gate terminal connected to the first node and a second one of the pair of transistors having its gate terminal connected to the reference voltage.

16. A circuit for providing an indication that a voltage of a primary power source transitions below a threshold level, comprising:
   a first transistor;
   a second transistor electrically coupled to the first transistor at a common node;
   a third transistor having a gate terminal coupled to the common node and a conduction terminal at which the indication is produced; and
   a pair of series connected threshold level trimming transistors, a first transistor of the pair having a gate terminal coupled to the common node, a second transistor of the pair receiving a threshold level trimming control signal, and the pair being coupled to the conduction terminal at which the indication is produced.

17. The circuit of claim 16, wherein the first transistor is coupled to the primary power source and a gate terminal of the second transistor is coupled to a substrate of the circuit.

18. The circuit of claim 16 wherein the first transistor exerts a pull which sets the threshold level, the pair of series connected threshold level trimming transistors adjusting the pull exerted by the first transistor in response to the threshold level trimming control signal to effectuate a change in the threshold level.

19. The circuit of claim 16 further including pull up circuitry connected between the external power supply voltage and the conduction terminal at which the indication is produced.

20. The circuit of claim 19 wherein the pull up circuitry comprises a pair of drain/source terminal series connected transistors which are connected between the external power supply voltage and the conduction terminal at which the indication is produced, a first one of the pair of transistors having its gate terminal connected to the first node and a second one of the pair of transistors having its gate terminal connected to the reference voltage.

* * * * *